United States Patent
Joseph et al.

(10) Patent No.: US 7,182,875 B2
(45) Date of Patent: Feb. 27, 2007

(54) MICROSTRUCTURES AND METHODS OF FABRICATION THEREOF

(75) Inventors: Paul Jayachandran Joseph, Atlanta, GA (US); Paul A. Kohl, Atlanta, GA (US); Sue Ann Bidstrup Allen, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 122 days.

(21) Appl. No.: 10/695,591

(22) Filed: Oct. 28, 2003

(65) Prior Publication Data

US 2004/0131829 A1    Jul. 8, 2004

Related U.S. Application Data

(60) Provisional application No. 60/422,530, filed on Oct. 31, 2002.

(51) Int. Cl.
  *C23F 1/00*    (2006.01)
(52) U.S. Cl. .......................................................... 216/2
(58) Field of Classification Search .................... 216/2, 216/24, 36, 27; 438/21, 702
  See application file for complete search history.

(56) References Cited

U.S. PATENT DOCUMENTS

| | | | |
|---|---|---|---|
| 5,525,190 A | | 6/1996 | Wojnarowski et al. ...... 385/133 |
| 6,096,656 A | * | 8/2000 | Matzke et al. .............. 438/702 |
| 6,599,436 B1 | * | 7/2003 | Matzke et al. ................ 216/24 |
| 6,815,329 B2 | * | 11/2004 | Babich et al. .............. 438/619 |
| 2002/0081787 A1 | * | 6/2002 | Kohl et al. .................. 438/200 |

OTHER PUBLICATIONS

International Search Report, International Application No. PCT/US03/34198.

P. A. Kohl, Q. Zhao, K. S. Patel, D. Schmidt, S. A. Bidstrup-Allen, R. Shick, S. Jayaraman, Air-Gaps for Electrical Interconnections, Electrochemical and Solid State Lett, vol. 1, p. 49, 1998.

P. A. Kohl, D. M. Bhusari, M. Wedlake, C. Case, B. C. Lee, R. J. Gutmann, R. Shick, Air-Gaps in 0.3 µm Electrical Interconnections, IEEE Electron Device Lett., vol. 21, p. 557, 2000.

H. A. Reed, C. E. White, V. Rao, S. A. Bidstrup-Allen, C. L. Henderson, P. A. Kohl, Fabrication of microchannels using polycarbonates as sacrificial materials, J Micromech Microeng., vol. 11(6), p. 733, 2001.

D. Bhusari, H. A. Reed, M. Wedlake, A. Padovani, S. A. Bidstrup-Allen, P. A. Kohl, Fabrication of Air-Channel Structures for Microfluidic, Microelectromechanical, and Microelectronic Applications, J Micromech. Microeng., vol. 10(3), p. 400, 2001.

(Continued)

*Primary Examiner*—Parviz Hassanzadeh
*Assistant Examiner*—Roberts Culbert
(74) *Attorney, Agent, or Firm*—The Webb Law Firm

(57) ABSTRACT

Microstructures and methods of fabricating microstructures are disclosed. One exemplary microstructure, among others, includes a substrate, an overcoat layer disposed upon the substrate, an air-region within at least a portion of the overcoat layer, and a framing material layer engaging at least a portion of the air-region on the inside of the framing material layer and engaging the overcoat layer on the outside of the framing material layer.

10 Claims, 2 Drawing Sheets

OTHER PUBLICATIONS

M. B. Anand, M. Yamada, H. Shibata, Use of Gas as Low-k Interlayer Dielectric in LSI's: Demonstration of Feasibility, IEEE Transactions on Electron Devices, vol. 44, p. 1965, 1997.

C. K. Harnett, G. W. Coates, H. G. Craighead, Heat-depolymerizable polycarbonates as electron beam patternable sacrificial layers for nanofluidics, J Vac. Sci. Technol B., vol. 19(6), p. 2842, 2001.

L. S. Loo, K. K. Gleason, Hot Filament Chemical Vapor Deposition of Polyoxymethylene as a Sacrificial Layer for Fabricating Air Gaps, Electrochemical and Solid State Lett., vol. 4, p. G81, 2001.

H-J. Suh, P. Bharathi, D. J. Beebe, J. S. Moore, Dendritic Material as a Dry-Release Sacrificial Layer, J. Microelectromech. Syst, vol. 9(2), pp. 198-205, 2000.

J. P. Gravesen, J. Bianejerg, O. S. Jensen, Microfluidics—A Review, J Micromech. Microeng., vol. 3, p. 168, 1993.

R. F. Service, Microchip Arrays Put DNA on the Spot, Science, vol. 282, p. 396, 1998.

J. V. Crivello, J. H. W. Lam, Diaryliodonium Salts. A New Class of Photoinitiatoers for Cationic Polymerization, Macromolecules, vol. 10(6), p. 1307, 1977.

R. Taylor, The Nature of the Transition State in Ester Pyrolysis. Part II. The Relative Rates of Pyrolysis of Ethyl, Isopropyl, and t-Butyl Acetates, Phenylacetates, Benzoates, Phenyl Carbonates, and N-Phenylcarbamates, J Chem. Soc, Chem. Commun., p. 1025, 1975.

S. Inoue, T. Tsuruta, T. Takada, N. Miyazaki, M. Kambe, T. Takaoka, Synthesis and Thermal Degradation of Carbon Dioxide-Epoxide Copolymer, Appl. Polym. Symp., vol. 26, p. 257, 1975.

J. M. J. Frechet, F. Bouchard, F. M. Houlihan, E. Eichler, B. Kryczka, C. G. Wilson, Design and synthesis of novel allyic and benzylic copolycarbonates susceptible to acidolytic or thermolytic depolymerization, Makromol. Chem. Rapid. Commun., vol. 7, p. 121, 1986.

S. C. Narang, S. T. Attarwala, Chemical Amplification in t-Diol Polycarbonate Resists, Polym. Prepr., (Am. Chem. Soc. Div. Polym., Chem ), vol. 26(2), p. 323, 1985.

D. J. Drensbourg, J. R. Wildeson, J. C. Yarbrough, J. H. Reibenspies, Bis 2,6-difluorophenoxide Dimeric Complexes of Zinc and Cadmium and Their Phosphine Adducts: Lessons Learned Relative to Carbon Dioxide/Cyclohexene Oxide Alternating Copolymerization Processes Catalyzed by Zinc Phenoxides, J Amer. Chem. Soc., vol. 122, p. 12487, 2000.

M. Murayama, F. Sanda, T. Endo, Anionic Ring-Opening Polymerization of a Cyclic Carbonate Having a Norbornene Structure with Amine Initiators, Macromolecules, vol. 31, p. 919, 1998.

Y. Toba, M. Saito, Y. Usui, Cationic Photopolymerization of Epoxides by Direct and Sensitized Photolysis of Onium Tetrakis(pentafluorophenyl)borate Iniators, Macromolecules, vol. 32(10), p. 3209, 1999.

J. V. Crivello, J. Lockhart, J. Lee, Diaryliodonium Salts as Thermal Initiators of Cationic Polymerization, J. Polym. Sci Part A: Polym. Chem., vol. 21, p. 97, 1983.

D. Bhusari, H. A. Reed,M. Wedlake, A. M. Padovani, S. A. Bidstrup-Allen, P. A. Kohl, Fabrication of Air-Channel Structures for Microfludic, Microelectromechanical, and Microelectronic Applications, J. Micrelectromechanical Sys., vol. 10, No. 3, pp. 400-408, Sep. 2001.

Xiaoqun Wu, et al.; Lithographic Characteristics and Thermal Processing of Photosensitive Sacrificial Materials; Journal of the Electrochemical Society, 149; 2002; pp. G555-G561.

Wu, X, Reed, H. A., Rhodes, L., Elce, E., Ravikiran, R., Shick, R.A., Henderson, C. L., Allen, S. A., and Kohl, P. A., "Photoinitiation Systems and Thermal Decomposition of Photodefinable Sacrificial Materials", Journal of Applied Polymer Science, 88, 1186-1195 (2003).

* cited by examiner

MICROSTRUCTURES AND METHODS OF FABRICATION THEREOF

CROSS-REFERENCE TO RELATED APPLICATION

This application claims priority to co-pending U.S. provisional application entitled "Silicon-di-oxide as a Structural Material to Resolve Incompatibility Issues in the Fabrication of Micro-Airchannels for MEMS" having Serial No. 60/422,530, filed on Oct. 31, 2002, which is entirely incorporated herein by reference.

STATEMENT REGARDING FEDERALLY SPONSORED RESEARCH OR DEVELOPMENT

The U.S. government may have a paid-up license in this invention and the right in limited circumstances to require the patent owner to license others on reasonable terms as provided for by the terms of MDA awarded by the National Science Foundation (Grant #DMI-9980804) of the U.S. Government.

TECHNICAL FIELD

The present invention is generally to related polymers, and, more particularly, is related to polymers, micro-air channels, and methods of using polymers to fabricate micro-air channels.

BACKGROUND

Microfluidic devices have tremendous potential for applications in a variety of fields including drug discovery, biomedical testing, and chemical synthesis and analysis. In such devices, liquids and gases are manipulated in microchannels with cross-sectional dimensions on the order of tens to hundreds of micrometers. Processing in such microchannel devices offers a number of advantages including low reagent and analyte consumption, highly compact and portable systems, fast processing times, and the potential for disposable systems. However, in spite of all of their promise, microfluidic devices are currently being used in a limited number of applications and are in general still rather simple devices in terms of their operational complexity and capabilities. One reason for their limited use is the difficulty in forming microchannels having a defined form.

For example, fluid microdynamics through the microchannels is important to avoid mixing in systems where mixing is not needed and therefore, the microchannels should have a defined cross-section consistent with the fluid microdynamics needed. However, fabricating a defined cross-section can be challenging. For example, the selection of sacrificial polymers and overcoats used to fabricate the microchannels can be limited due to solvent incompatibility of the sacrificial polymer and the overcoat. If the overcoat solvent dissolves the sacrificial polymer, the shape defined by the sacrificial material is compromised. In addition, the overcoat layer should provide sufficient mechanical strength to span the dimensions of the airchannel without sagging. Therefore, there is a need in the industry for versatile techniques to fabricate defined microchannels using a wider variety of polymer combinations.

SUMMARY OF THE INVENTION

Briefly described, embodiments of this disclosure, among others, include microstructures and methods of fabricating microstructures. One exemplary microstructure, among others, includes a substrate, an overcoat layer disposed upon the substrate, an air-region within at least a portion of the overcoat layer, and a framing material layer engaging at least a portion of the air-region on the inside of the framing material layer and engaging the overcoat layer on the outside of the framing material layer.

Another exemplary microstructure, among others, includes a substrate, an overcoat layer disposed upon the substrate, a sacrificial polymer layer disposed within at least a portion of the overcoat layer that, upon removal of the sacrificial polymer layer, forms an air-region, and a framing material layer engaging at least a portion of the sacrificial polymer layer on the inside of the framing material layer and engaging the overcoat layer on the outside of the framing material layer.

Methods of for fabricating microstructures are also provided. One exemplary method includes, among others: providing a substrate having a sacrificial polymer layer disposed thereon, disposing a framing material onto at least a portion of the sacrificial polymer layer, and disposing an overcoat layer onto the framing material, the framing material substantially separating the sacrificial polymer layer from the overcoat layer.

Another method for fabricating microstructures includes, among others: providing a structure having a substrate, an overcoat layer, and a sacrificial polymer layer in an area within the overcoat layer, a framing material between at least a portion of the sacrificial polymer layer and the overcoat layer; and removing the sacrificial polymer layer to form an air-region within the area defined by the sacrificial material.

Other structures, systems, methods, features, and advantages will be, or become, apparent to one with skill in the art upon examination of the following drawings and detailed description. It is intended that all such additional structures, systems, methods, features, and advantages be included within this description, be within the scope of the present invention, and be protected by the accompanying claims.

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of this disclosure. Moreover, in the drawings, like reference numerals designate corresponding parts throughout the several views.

DETAILED DESCRIPTION

In general, structures and methods of fabrication thereof are disclosed. Embodiments of the structures, among others, include an overcoat layer having at least one air-region therein. The air-region has a framing material layer engaging one or more portions (e.g., sides) of the air-region between the air-region and the overcoat layer. The framing material layer at least functions to provide a barrier layer between the overcoat layer and a sacrificial polymer layer. The sacrificial polymer layer defines an area, where upon removal of the sacrificial polymer layer the area defines the air-region. In addition, the framing material layer at least functions to provide mechanical support for the overcoat layer. Moreover, overcoats and sacrificial polymers that previously could not be used in conjunction with one another because of solvent incompatibility can be used in conjunction with one another with the use of the framing material layer.

In general, the structure having air-regions bounded, at least in part, by the framing material layer can be used in technology areas such as, but not limited to, microelectronics (e.g., microprocessor chips, communication chips, and optoeletronic chips), microfluidics, sensors, and analytical devices (e.g., microchromatography).

Figure 5A:
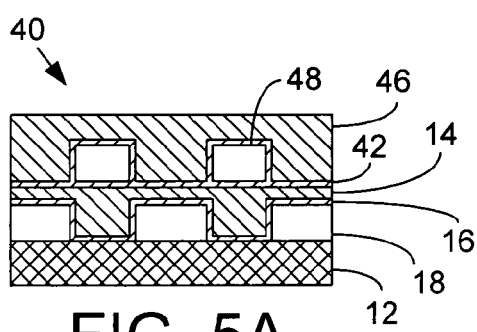
FIGS. 5A and 5B illustrate cross-sectional views of two embodiments of multi-level structures having air-regions including the framing material.
Figure 5B:
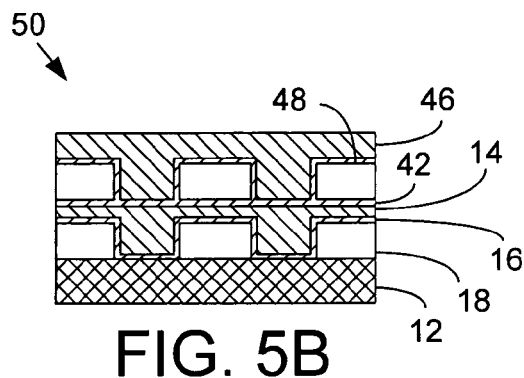

FIG. 2 is a cross-sectional view of a representative structure 10 including three air-regions 18. An overcoat layer 14 is disposed on the substrate 12 and includes the air-regions 18. The air-region may be filled with a gas, mixtures of gases, or be a vacuum. A framing material layer 16 is disposed between the air-regions 18 and the overcoat layer 14. In another embodiment, among others, the air-region 18 and framing material layer 16 can be positioned off of the substrate 12 and within the overcoat layer 14 (FIGS. 3A and 3B). In still another embodiment, among others, multiple air-regions 18 can be positioned at multiple heights (e.g., stacked on top of one another or stacked in an offset manner as shown in FIGS. 5A and 5B) in the overcoat layer 14.

Figure 1:
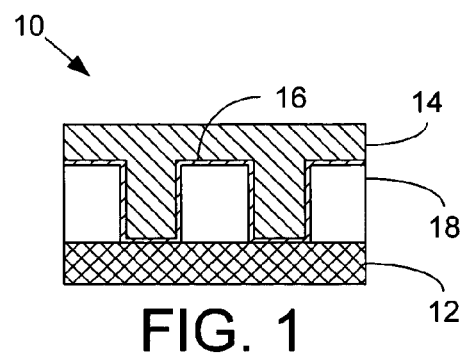
FIG. 1 illustrates a cross-sectional view of a representative structure having air-regions surrounded by a framing material.

The air-region 18 is formed by the removal (e.g. decomposition) of a sacrificial polymer layer from the area in which the air-regions 18 are located, as illustrated in FIG. 1. During the fabrication process of the structure 10, a sacrificial polymer layer is deposited onto the substrate 12 and patterned. Then, a framing material layer 16 is formed around the sacrificial polymer layer. Thereafter, the overcoat layer 14 is deposited around the framing material layer 16. Subsequently, the sacrificial polymer layer is removed forming the air-regions 18. The processes for depositing and removing the sacrificial polymer are discussed in more detail hereinafter.

Although a rectangular cross-section is illustrated for the air-regions 18, the three-dimensional boundaries of the air-regions can have cross-sectional areas such as, but not limited to, rectangular cross-sections, non-rectangular cross-sections, polygonal cross-sections, asymmetrical cross-sections, curved cross sections, arcuate cross sections, tapered cross sections, cross sections corresponding to an ellipse or segment thereof, cross sections corresponding to a parabola or segment thereof, cross sections corresponding to a hyperbola or segment thereof, and combinations thereof. For example, the three-dimensional structures of the air-regions 18 can include, but are not limited to, rectangular structures, polygonal structures, non-rectangular structures, non-square structures, curved structures, tapered structures, structures corresponding to an ellipse or segment thereof, structures corresponding to a parabola or segment thereof, structures corresponding to a hyperbola or segment thereof, and combinations thereof. In addition, the air-regions 18 can have cross-sectional areas having a spatially-varying height. Moreover, multiple air-regions can be interconnected to form microchannels and microchambers, for example.

The air-region 18 height can be from about 0.01 to about 100 micrometers and, more particularly, can be from about 2 to about 25 micrometers. The air-region 18 width can be from about 0.01 to about 10,000 micrometers and, more particularly, can be from about 0.1 to about 100 micrometers.

The substrate 12 can be used in systems such as, but not limited to, microprocessor chips, microfluidic devices, sensors, analytical devices, and combinations thereof. Thus, the substrate 12 can be made of materials appropriate for the system under consideration. Exemplar materials include, but are not limited to, glasses, silicon, silicon compounds, germanium, germanium compounds, gallium, gallium compounds, indium, indium compounds, other semiconductor materials and/or compounds, and combinations thereof. In addition, the substrate 12 can include non-semiconductor substrate materials, including any dielectric material, metals (e.g., copper and aluminum), or ceramics or organic materials found in printed wiring boards, for example.

The overcoat material used to form the overcoat layer 14 can be a modular polymer that includes the characteristic of being permeable or semi-permeable to the decomposition gases produced by the decomposition of a sacrificial polymer while forming the air-regions 18. In addition, the overcoat material is preferably stable in the temperature range in which the sacrificial polymer decomposes. Further, the overcoat can be solvent incompatible (e.g., the overcoat and the sacrificial polymer can be dissolved or partially dissolved in the same or similar solvent) with the sacrificial polymers described below.

Examples of the overcoat include compounds such as, but not limited to, polyimides, polynorbornenes, epoxides, polyarylenes ethers, polyarylenes, inorganic glasses, and combinations thereof. More specifically the overcoat includes compounds such as Amoco Ultradel™ 7501, Promerous Avatrel™ Dielectric Polymer, DuPont 2611, DuPont 2734, DuPont 2771, DuPont 2555, silicon dioxide, silicon nitride, and aluminum oxide. The overcoat can be deposited using techniques such as, for example, spin coating, doctor-blading, sputtering, lamination, screen or stencil-printing, evaporation, chemical vapor deposition (CVD), metalorganic chemical vapor deposition (MOCVD) and plasma-based deposition systems.

The framing material used to form the framing material layer 16 can include materials that do not substantially interact (i.e., compromise the three dimensional boundaries of the sacrificial polymer layer) with the sacrificial polymer. In particular, the framing material can include, but is not limited to, $SiO_2$, $Si_3N_4$, $SiO_xN_y$ (x can be from 0.01 to 2 and y can be from 0.01 to 1.33), and combinations thereof. In addition, the framing material can include, but is not limited to, polymers (e.g., Avatrel (polynorbornene-based polymer) and CVD parylene) that do not substantially interact with the sacrificial polymer.

The framing material layer 16 can cover portions of the sacrificial polymer that would otherwise come into contact with the overcoat and are sensitive to dimensional integrity. The coverage of the framing material layer 16 for a particular portion of the sacrificial polymer can range from about 50 to 100%. In other words, the framing material layer 16 does not have to be impervious to the overcoat material, but should act as a barrier between the sacrificial polymer and the overcoat until the overcoat cures, thereby maintaining the dimensional integrity of the air-regions 18. The framing material layer 16 can have a thickness from about 0.001 to about 10 micrometers, and more particularly from about 0.01 to about 2 micrometers.

The sacrificial polymer used to produce the sacrificial material layer can be a polymer that slowly decomposes and does not produce undue pressure build-up while forming the air-region within the surrounding materials. In addition, the decomposition of the sacrificial polymer produces gas molecules small enough to permeate the framing material layer 16 and the overcoat layer 18. Further, the sacrificial polymer has a decomposition temperature less than the decomposition or degradation temperature of the framing material and the overcoat material. Still further, the sacrificial polymer should have a decomposition temperature above the deposition or curing temperature of an overcoat material but less than the degradation temperature of the components in the structure in which the sacrificial polymer is being used.

The sacrificial polymer can include compounds such as, but not limited to, polynorbornenes, polycarbonates, polyethers, polyesters, functionalized compounds of each, and combinations thereof. The polynorbornene can include, but is not limited to, alkenyl-substituted norbornene (e.g., cycloacrylate norbornene). The polycarbonate can include, but is not limited to, norbornene carbonate, polypropylene carbonate, polyethylene carbonate, polycyclohexene carbonate, and combinations thereof.

In addition, the sacrificial polymer can include additional components that alter the processability (e.g., increase or decrease the stability of the sacrificial polymer to thermal and/or light radiation) of the sacrificial polymer. In this regard, the components can include, but are not limited to, photoinitiators and photoacid initiators.

As mentioned above, the overcoat can be solvent incompatible with the sacrificial polymer. Previously, combinations of overcoat and sacrificial polymers could not be used in conjunction without problems due to solvent incompatibility. For example, the following combinations of overcoat and sacrificial polymer could not be used previously, but can be used in conjunction with the framing material layer: Avatrel:polycyclohexene carbonate, Avatrel:polynorbornene carbonate, polyimide:polypropylene carbonate, and polyimide:polyethylene carbonate.

Figure 2A:
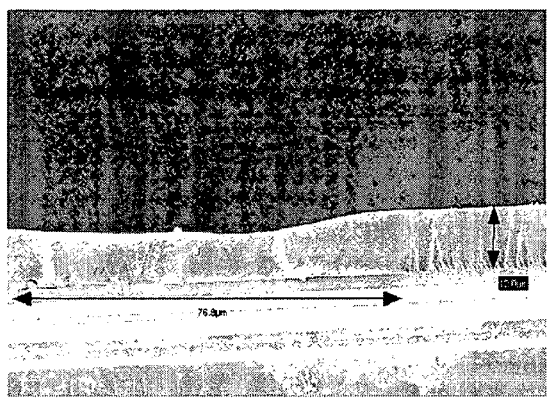
FIGS. 2A and 2B illustrate SEM images of structures having air-regions that are not surrounded by a framing material.
Figure 2B:
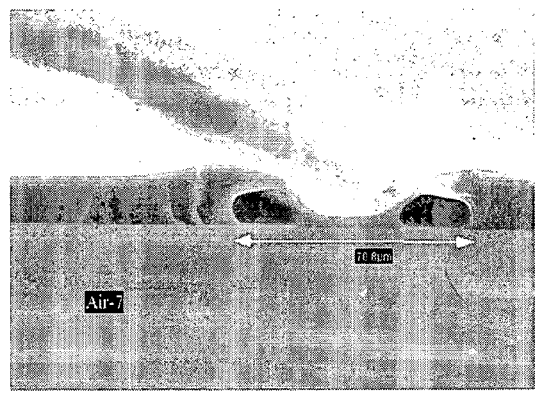
Figure 3A:
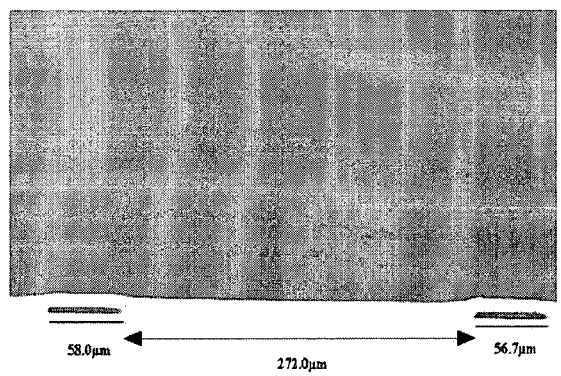
FIGS. 3A and 3B illustrate SEM images of structures having air-regions that are surrounded by a framing material.
Figure 3B:
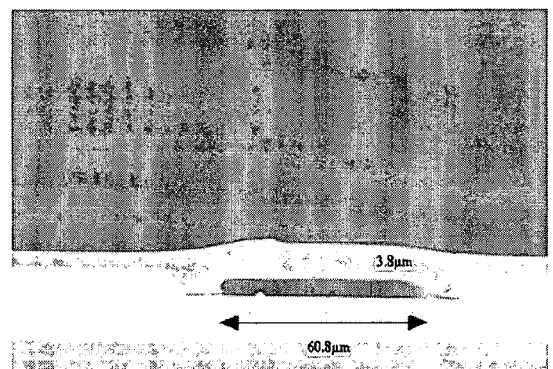

For example, FIGS. 2A and 2B illustrate SEM images of air-regions that are not surrounded by the framing material layer, while FIGS. 3A and 3B illustrate SEM images of air-regions surrounded by the framing material layer. In FIGS. 2A and 2B the air-regions are compromised because the overcoat layer collapsed, sagged, and/or dissolved some of the sacrificial polymer, rendering the air-regions unusable for many applications. In contrast, in FIGS. 3A and 3B the air-regions are not compromised because the overcoat layer did not substantially collapse, sag, and/or dissolve some of the sacrificial polymer because of the framing material layer (e.g., $SiO_2$).

The sacrificial polymer can be deposited onto the substrate using techniques such as, for example, spin coating, doctor-blading, sputtering, lamination, screen or stencil-printing, melt dispensing, evaporation, CVD, MOCVD, and plasma-based deposition systems.

The thermal decomposition of the sacrificial polymer can be performed by heating the structure 10 to the decomposition temperature of the sacrificial polymer and holding at that temperature for a certain time period (e.g., 1–2 hours). Thereafter, the decomposition products diffuse through the overcoat layer 14 leaving a virtually residue-free hollow structure (air-region 18).

Although not illustrated, the air-regions 18 can be formed in conjunction with other air-regions and/or air-channels to form microfluidic devices, sensors, and analytical devices, for example. It should be noted that additional components could be disposed on and/or within the substrate 12, the overcoat layer 14, the sacrificial polymer layer, and/or the air-regions 12. The additional components can include, but are not limited to, electronic elements (e.g., switches and sensors), mechanical elements (e.g., gears and motors), electromechanical elements (e.g., movable beams and mirrors), optical elements (e.g., lens, gratings, and mirror), opto-electronic elements, fluidic elements (e.g., chromatograph and channels that can supply a coolant), and combinations thereof.

Now having described the structure 10 having air-regions 18 in general, the following describes exemplar embodiments for fabricating the structure 10. It should be noted that for clarity, some portions of the fabrication process are not included in FIGS. 4A through 4D. As such, the following fabrication process is not intended to be an exhaustive list that includes all steps required for fabricating the structure 10. In addition, the fabrication process is flexible because the process steps may be performed in a different order than the order illustrated in FIGS. 4A through 4D, or some steps may be performed simultaneously.

FIGS. 4A through 4D are cross-sectional views that illustrate a representative method of fabricating the structure 10 having the air-regions 18 illustrated in FIG. 1. It should be noted that for clarity, some portions of the fabrication process are not included in FIGS. 4A through 4D. As such, the following fabrication process is not intended to be an exhaustive list that includes all steps required for fabricating the structure 10. In addition, the fabrication process is flexible because the process steps may be performed in a different order than the order illustrated in FIGS. 4A through 4D and/or some steps may be performed simultaneously.

Figure 4A:
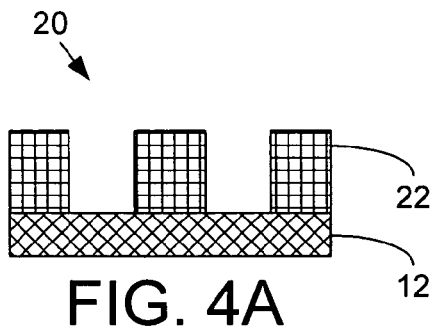
FIGS. 4A through 4D are cross-sectional views that illustrate a representative method of fabricating the structure illustrated in FIG. 1.

FIG. 4A illustrates the substrate 12 having a patterned sacrificial polymer layer 22 disposed thereon. The sacrificial polymer layer 22 can be deposited onto the substrate 10 using techniques such as, for example, spin coating, doctor-blading, sputtering, lamination, screen or stencil-printing, melt dispensing, CVD, MOCVD, and plasma-based deposition systems.

Figure 4C:
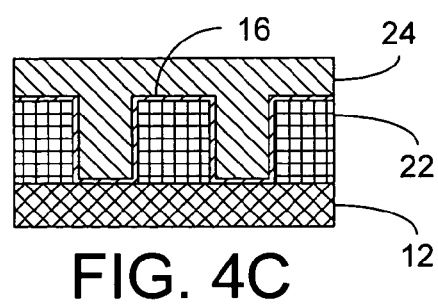
Figure 4B:
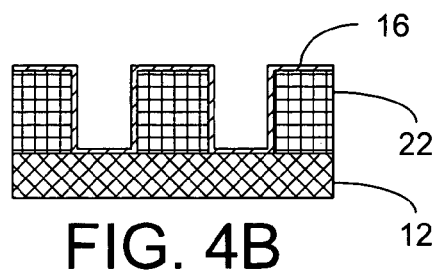

FIG. 4B illustrates the formation of the framing material layer 16 on the sacrificial polymer layer 22 and the substrate 12. The framing material layer 16 can be formed using techniques such as, but not limited to, CVD, MOCVD, evaporation, and plasma assisted deposition.

FIG. 4C illustrates the formation of the overcoat layer 24 upon the framing material layer 16. The overcoat layer 24 can be deposited onto the substrate using techniques such as, for example, spin coating, doctor-blading, sputtering, lamination, screen or stencil-printing, melt dispensing, CVD, MOCVD, and plasma-based deposition systems.

Figure 4D:
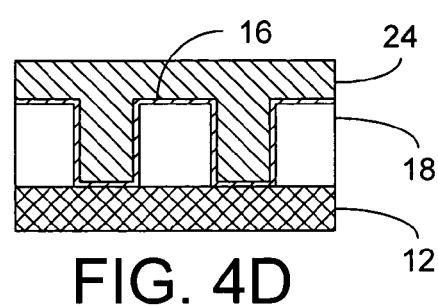

FIG. 4D illustrates the thermal decomposition of the sacrificial polymer layer 22 to form the air-regions 18. As mentioned above, the sacrificial polymer layer 22 can be decomposed by heating the sacrificial polymer layer 22 to a temperature sufficient to decompose the polymer (e.g., from about 50 to 425° C.).

FIGS. 5A and 5B illustrate cross-sectional views of two embodiments of multi-level structures 40 and 50. FIG. 5A is a cross-sectional view of a multi-level structure 40 having alternative stacking (offset stacking) of air-regions 18 and 48 including framing material layers 16 and 42. The first layer of air-regions 18 is disposed upon a substrate 12 and within an overcoat layer 14. A framing material layer 16 is positioned between the air-regions 18 and the overcoat layer 14. A second layer of air-regions 48 is disposed with an overcoat layer 46. A framing material layer 42 is positioned between the air-regions 48 and the overcoat layer 46. The framing material layers 16 and 42 can be the same or different materials, while the overcoat layers 14 and 46 can also be the same or different polymers.

FIG. 5B is a cross-sectional view of a multi-level structure 50 having parallel stacking (stacking substantially on top and in-line of another air-region below) of air-regions 18 and 48, including framing material layers 16 and 42. The first layer of air-regions 18 is disposed upon a substrate 12 and within an overcoat layer 14. A framing material layer 16 is positioned between the air-regions 18 and the overcoat layer 14. A second layer of air-regions 48 is disposed with an overcoat layer 46. A framing material layer 42 is positioned between the air-regions 48 and the overcoat layer 46. The framing material layers 16 and 42 can be the same or different materials, while the overcoat layers 14 and 46 can be the same or different polymers.

It should be emphasized that the above-described embodiments of this disclosure are merely possible examples of implementations, and are set forth for a clear understanding of the principles of this disclosure. Many variations and modifications may be made to the above-described embodiments of this disclosure without departing substantially from the spirit and principles of this disclosure. All such modifications and variations are intended to be included herein within the scope of this disclosure and protected by the following claims.

The invention claimed is:

1. A method for fabricating a microstructure, comprising:
    providing a substrate having a patterned sacrificial polymer material layer disposed thereon, said patterned sacrificial polymer layer comprising at least a first distinct portion and a second distinct portion;
    disposing a framing material layer over said at least first and second distinct portions such that said framing material layer engages the sacrificial material of each distinct portion;
    disposing a non-sacrificial overcoat layer over said framing material layer such that said overcoat layer is substantially separated from the sacrificial material of said at least first and second distinct portions by said framing material layer, said overcoat layer is selected from polynorbornenes, epoxides, polyarylene ethers, parylenes and combinations thereof; and
    removing the sacrificial polymer material from said at least first and second distinct portions via thermal decomposition such that microstructures are formed.

2. The method of claim 1, where removing the sacrificial material creates an air-region within each of the at least first and second distinct portions.

3. The method of claim 1, where said framing material layer is selected from $SiO_2$, $Si_3N_4$, $SiO_xN_y$, (where x is from 0.01 to 2 and y is from 0.01 to 1.33), and $Al_2O$.

4. The method of claim 1, where the sacrificial polymer material is selected from polynorbornenes, polycarbonates, polyethers, polyesters, functionalized compounds of each, and combinations thereof.

5. The method of claim 1, where removing the sacrificial polymer comprises heating the at least first and second distinct portions to a first temperature greater than or equal to the decomposition temperature of the sacrificial polymer material.

6. The method of claim 5, where removing the sacrificial polymer further comprises, maintaining the first temperature for at least one to two hours.

7. A method for fabricating a microstructure, comprising:
    providing a structure comprising
        a substrate,
        an overcoat layer comprising a material selected from polynorbornenes, epoxides, polyarylene ethers, parylenes, and combinations thereof,
        a plurality of sacrificial polymer portions disposed within the overcoat layer, each of such portions comprising a sacrificial polymer material selected from polycarbonates, polyesthers, polyesters, functionalized compounds of each, and combinations thereof,
        a framing material layer disposed over each sacrificial polymer portion and engaging one or more sides of each sacrificial polymer portion on the inside of the framing material layer and engaging the overcoat layer on the outside of the framing material layer where sacrificial polymer portions that would otherwise contact the overcoat layer are engaged; and
    removing the sacrificial polymer material from each of the sacrificial polymer portions via thermal decomposition to form an air-region therein, such that the inside of said framing material layer engages each air-region and the outside of said framing material layer engages the overcoat layer.

8. The method of claim 7, where the sacrificial polymer material is solvent-incompatible with the material of the overcoat layer.

9. The method of claim 7, where removing the sacrificial polymer material comprises heating the plurality of sacrificial polymer portions to a first temperature equal to or greater than the decomposition temperature of the sacrificial polymer material for at least one to two hours.

10. The method of claim 9, where the first temperature is from about 50 to 425° C.

* * * * *

UNITED STATES PATENT AND TRADEMARK OFFICE
CERTIFICATE OF CORRECTION

PATENT NO. : 7,182,875 B2 Page 1 of 1
APPLICATION NO. : 10/695591
DATED : February 27, 2007
INVENTOR(S) : Joseph et al.

It is certified that error appears in the above-identified patent and that said Letters Patent is hereby corrected as shown below:

<u>Column 8</u>, line 27, Claim 7, "polyesthers" should read -- polyethers --

<u>Column 8</u>, Line 33, Claim 7, "where sacrificial" should read -- where all sacrificial --

Signed and Sealed this

Third Day of July, 2007

JON W. DUDAS
*Director of the United States Patent and Trademark Office*